US012592542B2

(12) United States Patent
Popp et al.

(10) Patent No.: US 12,592,542 B2
(45) Date of Patent: Mar. 31, 2026

(54) SEMICONDUCTOR COMPONENT

(71) Applicant: TRUMPF Photonic Components GmbH, Ulm (DE)

(72) Inventors: Andreas Popp, Markgroeningen (DE); Alexander Marc Van der Lee, Venlo (NL); Sven Bader, Neu-Ulm (DE); Roman Koerner, Lonsee (DE); Jenny Tempeler, Ulm (DE); Michael Smeets, Neu-Ulm (DE); Andrea Ott, Beimerstetten (DE); Markus Herper, Aachen (DE); Daniela Stange, Langenau (DE)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 918 days.

(21) Appl. No.: 17/848,407

(22) Filed: Jun. 24, 2022

(65) Prior Publication Data

US 2022/0416504 A1 Dec. 29, 2022

(30) Foreign Application Priority Data

Jun. 28, 2021 (DE) ...................... 10 2021 116 631.4

(51) Int. Cl.
*H01S 5/062* (2006.01)
*H01S 5/068* (2006.01)
*H01S 5/183* (2006.01)

(52) U.S. Cl.
CPC ...... *H01S 5/06821* (2013.01); *H01S 5/06236* (2013.01); *H01S 5/18344* (2013.01); *H01S 5/18355* (2013.01)

(58) Field of Classification Search
CPC ............. H01S 5/06821; H01S 5/06236; H01S 5/18344; H01S 5/18355; H01S 5/18386; H01S 5/3201; H01S 5/04256; H01S 5/423
See application file for complete search history.

(56) References Cited

U.S. PATENT DOCUMENTS

| 5,331,654 A | 7/1994 | Jewell et al. |
| 6,483,860 B1 | 11/2002 | Ueki et al. |
| 2005/0053110 A1 | 3/2005 | Kaneko |
| 2007/0093128 A1 | 4/2007 | Thomas et al. |

(Continued)

FOREIGN PATENT DOCUMENTS

| EP | 1104056 A1 | 5/2001 |
| JP | 2003332685 A | 11/2003 |

(Continued)

*Primary Examiner* — Yuanda Zhang
(74) *Attorney, Agent, or Firm* — LEYDIG VOIT & MAYER LTD.

(57) ABSTRACT

A semiconductor component for emitting light includes a main body that comprises at least one mesa body. The mesa body has an emission region for emitting the light. The emission region is assigned a first mirror portion, a second mirror portion, and an active portion arranged between the two mirror portions and serving to produce the light. The semiconductor component further includes electrical contacts for feeding electrical energy into the active portion, with at least one stress element that is attached to a surface of the main body. The stress element is configured to generate in the main body a material stress which has an effect on one or more polarization properties of the emitted light.

20 Claims, 6 Drawing Sheets

(56)     References Cited

U.S. PATENT DOCUMENTS

| 2007/0242715 | A1* | 10/2007 | Gustavsson ......... | H01S 5/18355 |
| | | | | 372/45.01 |
| 2015/0380606 | A1* | 12/2015 | Padullaparthi ...... | H01S 5/18313 |
| | | | | 438/40 |
| 2017/0365982 | A1* | 12/2017 | Bachmann ........... | H01S 5/2054 |
| 2020/0203927 | A1* | 6/2020 | Lee ....................... | H01S 5/0422 |

FOREIGN PATENT DOCUMENTS

| JP | 2009259857 A | 11/2009 | | |
| JP | 2011003748 A | 1/2011 | | |
| WO | WO-2005082010 A2 * | 9/2005 | ........... | H01S 5/0607 |

* cited by examiner

SEMICONDUCTOR COMPONENT

CROSS REFERENCE TO RELATED APPLICATIONS

This application claims benefit to German Patent Application No. DE 10 2021 116 631.4, filed on Jun. 28, 2021, which is hereby incorporated by reference herein.

FIELD

Embodiments of the present invention relate to a semiconductor component for emitting light, and to a method for producing a material stress within a main body of a semiconductor component.

BACKGROUND

Strong electric fields can be formed on account of the small structural size, and these can have an effect on the refractive index of the material forming the basis of a semiconductor component. By way of example, this effect can be problematic in the case of vertical-cavity surface-emitting lasers (VCSELs), according to which the polarization direction of the emitted light may not be permanently stationary under all operating conditions.

SUMMARY

Embodiments of the present invention provide a semiconductor component for emitting light. The semiconductor component includes a main body that comprises at least one mesa body. The mesa body has an emission region for emitting the light. The emission region is assigned a first mirror portion, a second mirror portion, and an active portion arranged between the two mirror portions and serving to produce the light. The semiconductor component further includes electrical contacts for feeding electrical energy into the active portion, with at least one stress element that is attached to a surface of the main body. The stress element is configured to generate in the main body a material stress which has an effect on one or more polarization properties of the emitted light.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
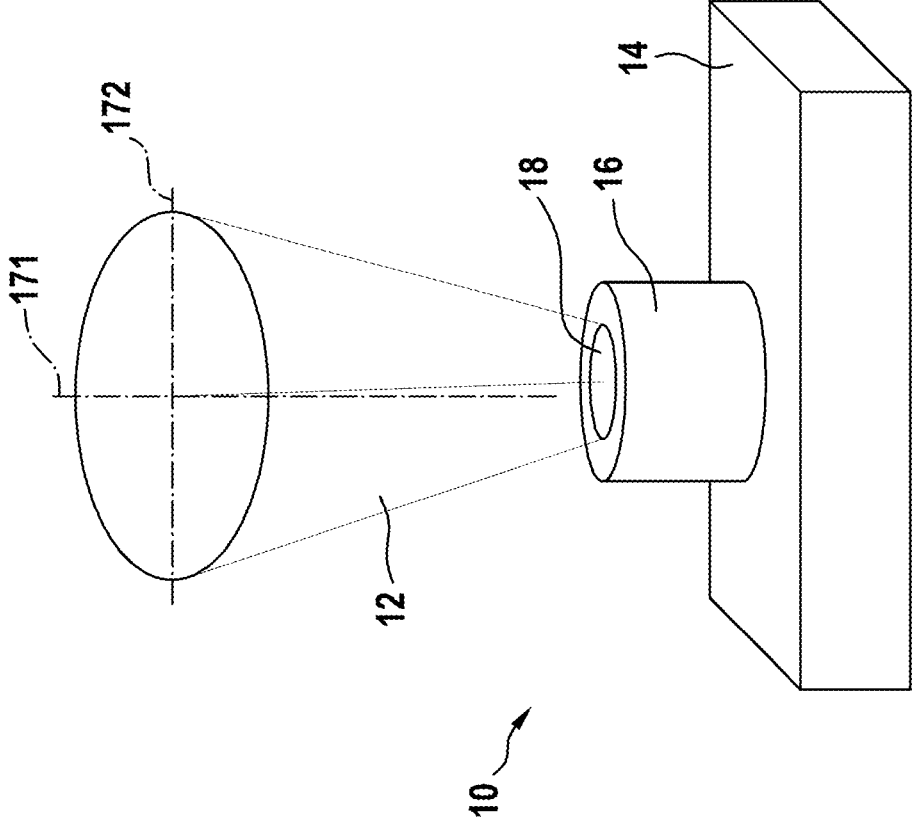
FIG. 1 shows a semiconductor component for emitting light, having a main body and a mesa body.

Light-emitting semiconductor components such as VCSELs, which may also be equipped with an integrated photodiode for example and which are used in sensor applications in particular, however may require a polarization of the emitted light that is stable in respect of the polarization direction and preferably linear.

The provision of a semiconductor component for emitting light is proposed, said semiconductor component comprising a main body that comprises a mesa body having an emission region for the light, which is assigned a first mirror portion, a second mirror portion and an active portion arranged between the two mirror portions and serving to produce the light, and said semiconductor component comprising electrical contacts for feeding electrical energy into the active portion, with at least one, preferably mechanical stress element being attached to a surface of the main body and generating, in the main body, an additional material stress in the preferred direction which has an effect on properties, such as a polarization extinction ratio, of the emitted light.

The main body and the mesa body contain at least partly crystalline semiconductor material, through which the light can propagate in order to be able to emerge from the emission region to the outside. The crystalline semiconductor material has birefringent properties. The emergent light is essentially polarized in two mutually independent, preferably orthogonal directions. The ratio of the two intensities of the polarization directions is referred to as polarization extinction ratio (PER).

The material stress additionally generated by the stress element may have in terms of the stress intensity a reducing gradual profile in the direction of the interior of the main body starting from the stress element. Further, a stress element preferably generates a material stress which predominantly acts in one direction within the material of the main body.

Properties of the emergent light can be changed by the material stress, with the polarization extinction ratio in particular being changed. In particular, the polarization extinction ratio can be changed by virtue of changing birefringent properties of the crystalline material that forms the basis of the main body. Depending on the alignment of the material stress in relation to the crystal axes, for example in the (110) or (1-10) direction according to Miller indices, it is possible to cause a change in the intensity of the two polarization directions. In particular, the intensity of a first polarization direction is increased and the intensity of a second polarization direction is reduced at the same time.

In particular, the semiconductor component can be a surface emitter (VCSEL; vertical-cavity surface-emitting laser). The light can be a coherent laser light in particular, which emerges divergently from the emission region. The light can be polarized, collimated or focused by optical elements, which preferably include diffractive, refractive and/or photonic meta-material. In particular, the semiconductor component can be a combination of at least one VCSEL with at least one integrated photodiode.

It is advantageous for at least one of the electrical contacts to comprise a stress element, the stress element being able to be a metallic coating on the mesa body in particular. In this context, the stress element may be electrically conductive and have an electrical connection to the electrical contact. The stress element may be an integral constituent part of the electrical contact. A compact structure of the semiconductor component can be ensured by way of the functional connection between the stress element and the electrical contact.

It is further advantageous to design the stress element in stripe-type fashion, the stress element preferably extending between the emission region and a connection portion of the electrical contact. A force predominantly directed along the longitudinal extent of the stress element acts on the material volume as a result of a stripe-type stress element, said force being expressed in an additional material stress within the material of the main body. As a result, the material stress is distinguished by a magnitude that is directed predominantly along the longitudinal extent of the stress element. Preferably, a material stress transverse to the longitudinal extent of the stress element can be neglected.

In a development, provision can be made for at least two separate stress elements to be attached to the main body and for each to generate a predominant material stress in a different direction, the different directions preferably extending at an angle of 0°, 45° and/or 90° with respect to one another and/or with respect to the crystal axes of the material of the semiconductor device. In particular, it is conceivable to arrange exactly two mutually perpendicular stress elements on the surface of the main body, said stress elements generating two substantially perpendicular material stresses. A semiconductor component can preferably comprise two mesa bodies, with each mesa body being assigned one stress element in particular. As a result of the many possibilities for arranging the advantageous stress elements, it is possible to form the material stress within the main body in virtually any desired manner.

By preference, at least one, preferably two or three stress elements end at the emission region. As a result, the force generated by the stress element is able to generate a material stress in the region of the emission region and preferably in the mesa body. The polarization direction of the emitted radiation, and hence the polarization extinction ratio, can be influenced in a very efficient manner, in particular, by generating a material stress in the mesa body.

To obtain a further option for varying the material stress in the mesa body, the at least one stress element can be guided past the emission region, the stress element being able to extend beyond the emission region. As a result, a material stress extending laterally with respect to the emission region can be generated, said material stress being formed along the entire extent of the emission region. The material stress will essentially be formed in the formative material of the mesa body, which is located below the plane of the surface in which the emission region is arranged.

In particular, provision can be made for a longitudinal extent of the stress element to include an angle of 0°, 45° and/or 90° with a crystal axis of the main body. The crystal axis is specified by the crystal structure of the crystal underlying the material of the semiconductor component. By way of example, the crystal axes can be specified by mutually independent spatial directions within the crystal. By preference, the crystal axes are specified by directions within the crystal in which the periodic repetition of the crystal structure has the shortest distances. These crystal directions are also referred to as principal crystal directions. In the case of gallium arsenide, these may be in the (110) or (1-10) direction.

The material stress generated by the stress elements can advantageously be influenced by virtue of an additional layer being applied to the stress element for example by means of atomic layer deposition and/or plasma-enhanced chemical vapor deposition (PECVD), said layer preferably also covering the remaining surface. In this context, the material stress can easily be amplified by this optional layer without additional stress elements.

Additionally, a polarization grating can interact with an emission region and can be preferably arranged on the surface of the mesa body, a grating alignment of the polarization grating in particular including an angle of 0°, 45° and/or 90° with a crystal axis of the semiconductor device and/or with a direction of a predominant material stress and/or a longitudinal extent of a stress element. The grating alignment is determined by the longitudinal extent of the grating ribs.

The stress element is particularly preferably realized with at least two layers, which contain titanium, nickel, platinum, gold in particular. By way of example, the layers can be created by an evaporation method and/or a galvanic deposition method, e.g., for gold, and/or any other deposition method. By combining different metals, it is possible to influence the effect of the stress elements on the intensity of the material stress.

In particular, the stress element can be at least >1 μm long and >0.1 μm wide and >0.01 μm high.

Further, the main body may contain indium, gallium, arsenic and/or phosphorus.

Further, a method for producing a material stress within a main body of a semiconductor component is proposed, the method containing an application of a preferably metallic, in particular stripe-type stress element to the surface of the main body during an annealing step. In this case, the apparatus according to embodiments of the invention can be a product of the method. In this case, the stress element may be applied by means of, for example, an evaporation method or any other deposition method during the annealing step.

The material stress arises in particular as a result of the main body with the applied stress element cooling, such that a material stress forms. In particular, the material stress forms on account of materials behaving differently during temperature changes.

According to the method, a layer, also referred to as ALD layer, may be applied to the stress element and/or the main body by means of atomic layer deposition. The layer can generate material stresses and/or advantageously influence these.

It is understood that the features specified above and the features yet to be explained below can be used not only in the respectively specified combination but also in other combinations.

The scope of the invention is only defined by the claims.

FIG. 1 depicts a semiconductor component 10 which is embodied to emit light 12. The light 12 can be coherent light such as laser light. In this case, wavelengths ranging from 550 nm to 1500 nm, in particular, are possible, with wavelengths between 700 nm and 1000 nm, in particular, being emitted. The light 12 can be a coherent laser light in particular, which emerges divergently from the emission region. The light 12 can be polarized, collimated or focused by optical elements, which preferably include diffractive, refractive and/or photonic meta-material.

The semiconductor component 10 comprises a main body 14, which has a mesa body 16 with an emission region 18 for the light 12. Both the main body 14 and the mesa body 16 may comprise crystalline semiconductor material at least in part, the latter containing indium, gallium, arsenic and/or phosphorus. The emission region 18 is a surface location from where the light 12 emerges from the semiconductor component 10 into the surroundings. The surroundings may include optical devices for refraction and diffraction, into which the light 12 enters, but may also merely be an air-filled or evacuated space. The mesa body 16 may be tower-shaped and, in particular, have a circular cylindrical form, wherein the radius or the diameter can be approximately ≤30 μm, with a diameter of ≤20 μm also being possible. Alternatively, the diameter may also be greater than 30 μm.

A first mirror portion, a second mirror portion and an active portion arranged between the two mirror portions and serving to produce the light 12 are assigned to the mesa body 16. The mirror portions and the active portion are not depicted in the drawings, although the material stress may also have an effect on said mirror portions and said active portion. They may be wholly or partially encompassed by the mesa body 12. In particular, the mirror portions and the active portion are arranged in the main body 14.

The crystalline semiconductor material of the main body 14 and/or mesa body 16 has birefringent properties, and so the light 12 that propagates through the semiconductor material is polarized in two different directions. The emergent light 12 is essentially polarized in two preferably mutually orthogonal polarization directions 171, 172. The two polarization directions 171, 172 generate an elliptical polarization post emergence as a result of the mixing of their intensities, with the longitudinal extent of the resultant ellipse being directed in the more intensive polarization direction 171, 172. However, a linear polarization of the emitted light is ideally sought after.

The ratio of the intensities of the two polarization directions 171, 172 is referred to as polarization extinction ratio. The polarization extinction ratio can be influenced by material stresses in the crystalline semiconductor material.

Light-emitting semiconductor components 10 such as VCSELs, which are used in sensor applications in particular, require a time-stationary polarization extinction ratio of the emitted light 12. This can be achieved by virtue of the intensities of the polarization directions 171, 172 being stable over time. Preferably, one polarization direction, in particular the more intense polarization direction, is preferred in the process.

Figure 2:
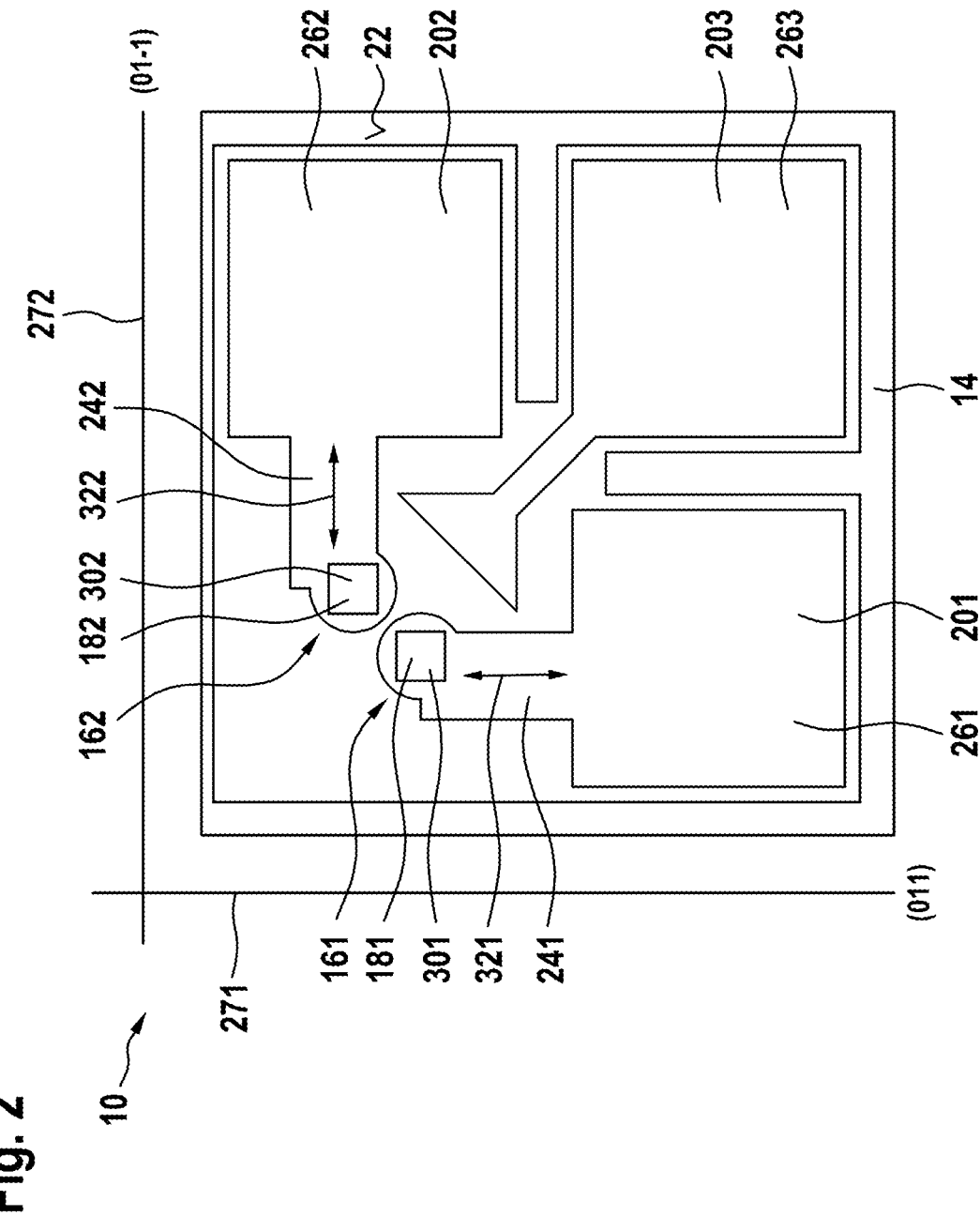
FIG. 2 shows a surface of the semiconductor component having a plurality of stress elements.
Figure 3A:
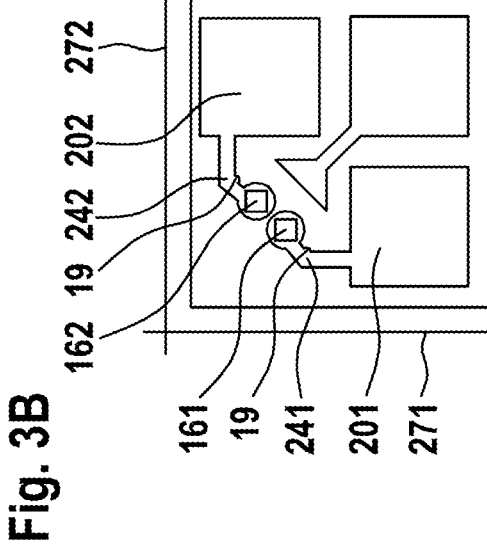
FIGS. 3A, 3B, 3C, and 3D show different embodiments of electrical contacts with stress elements.
Figure 3B:
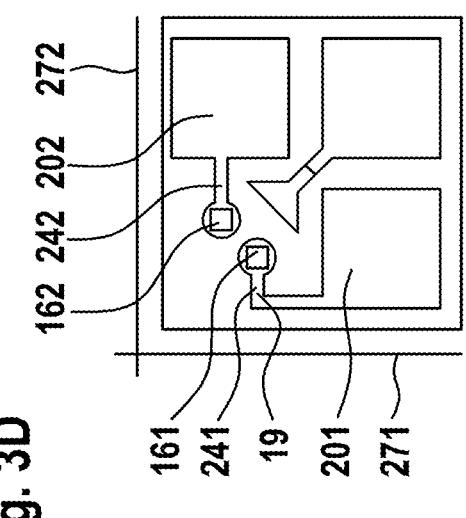
Figure 3C:
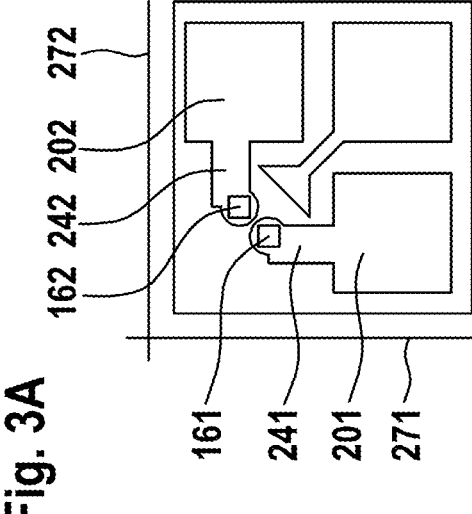
Figure 3D:
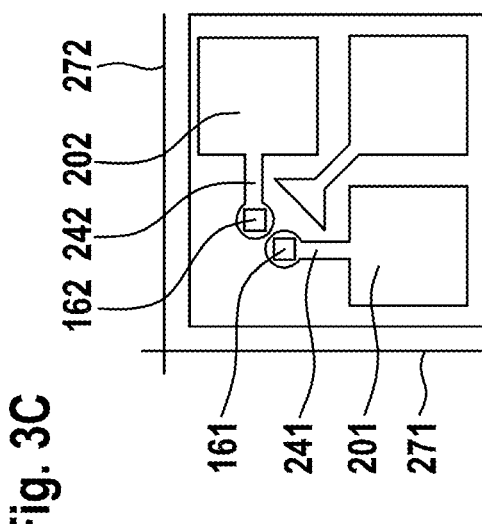

FIG. 2 depicts a surface 22 of an exemplary semiconductor component 10, which has a first and a second mesa body 161, 162 on preferably a common main body 14. Electrical contacts 201, 202, 203, which serve to feed electrical energy into the active portion of the mesa bodies 161, 162, are applied to the surface 22.

The electrical contacts 20; 201, 202, 203 are divided into two so-called p-contacts and one n-contact. The p-contacts 201, 202 are guided directly to the mesa bodies 16; 161, 162 in FIG. 2, and the n-contact is arranged between the two p-contacts. This configuration is not mandatory. Each p-contact 20; 201, 202 has a stress element 24; 241, 242 and each contact 20; 201, 202, 203 has a connection portion 26; 261, 262, 263 provided for electrically connecting the semiconductor component 10 to peripheral devices not depicted here. Merely one contact 20; 201, 202 may be equipped with a stress element 24; 241, 242. Alternatively, all p-contacts 20, 201, 202 may be equipped with stress elements. In the case of an embodiment not depicted here, the n-contact 203 may likewise have a stress element 24.

The stress element 24; 241, 242 is of a stripe-type design, with the stress element 24; 241, 242 preferably extending between the respective emission region 181, 182 and the respectively assigned connection portion 26; 261, 262.

In the exemplary embodiment of FIG. 2, the first stripe-type stress element 241 extends along a first crystal axis 271 and the second stripe-type stress element 242 extends along a second crystal axis 272. By way of example, the crystal axes 271, 272 may be represented by the Miller indices (011) and (01-1). Other Miller indices are also conceivable. The two stress elements 24; 241, 242 are essentially arranged perpendicular to one another in the plane of the surface 22.

A force predominantly directed along the longitudinal extent of the stress element 24; 241, 242 acts on the material volume as a result of a stripe-type stress element 24; 241, 242, said force being expressed in a material stress 25 within the material of the main body 14. When the stress element 24; 241, 242 is arranged on the mesa body 16, then it also generates a material stress 25 in the mesa body 16. The stress element 24; 241, 242 generates a material stress 25, which has an effect on the birefringent properties of the crystalline semiconductor material. The polarization extinction ratio is influenced as a result. In particular, the intensity of a first polarization direction 171 is increased and the intensity of a second polarization direction 172 is reduced at the same time, or vice versa.

In the case of stripe-type stress elements 24; 241, 242, the material stress 25 is distinguished by a magnitude directed predominantly along the longitudinal extent of the stress element 24; 241, 242. Preferably, a material stress 25 transverse to the longitudinal extent of the stress element 24; 241, 242 can be neglected. In this case, the material stress 25 is strongest in the region of the surface 22 in particular and decreases with increasing depth perpendicular to the surface 22.

In particular, the stress element 24; 241, 242 can be at least >1 μm long and >0.1 μm wide and >0.01 μm high. It is preferable for the stress element 24; 241, 242 to extend from the mesa body 16 in stripe-type fashion.

Preferably, the stress element 24; 241, 242 can have at least two layers with different metals. In particular, the layers may contain titanium, nickel, platinum, gold. By way of example, the layers can be created by an evaporation method or any other deposition method. By combining different metals, the intensity of the material stress can be increased by the stress elements 24; 241, 242 without having to apply stress elements that are thicker than a stress element made of a single metal. Expressed differently, a multilayer stress element, which is preferably constructed from different metals, can generate a greater material stress in the case of the same thickness. Further, a stress element preferably generates a material stress 25 which predominantly acts in one direction within the material of the main body 14 and/or mesa body 16.

Additionally, a polarization grating 30; 301, 302 can be arranged on the respective emission region 18; 181, 182. The polarization grating 30; 301, 302 is preferably arranged on the surface 22 of the mesa body 16; 161, 162. Alternatively, the polarization grating 30; 301, 302 may also be arranged within the semiconductor component 10.

According to FIG. 1, the first polarization grating 301 has a grating alignment of 90° and the second polarization grating 302 has a grating alignment of 0°, in each case in relation to the stress element 241, 242 assigned to the respective mesa body 161, 162. The grating alignment is determined by the angle between the longitudinal extent of the grating ribs of the polarization grating 301, 302 and the longitudinal extent 321, 322 of the respectively assigned stress element 241, 242, and hence with a direction of a predominant material stress 25. One stress element 241, 242 in each case extends from the respective mesa body 161, 162.

In FIG. 3, different alignments of the stress elements 241, 242 of a semiconductor component 10 with a main body 14 and two mesa bodies 16 are depicted in images A, B, C and D, with the alignment of image A corresponding to that of FIG. 2. This configuration of the stress elements 241, 242 can feature less than 15 dB for the polarization extinction ratio of the first mesa body 161 and more than 15 dB, in particular more than 20 dB for the polarization extinction ratio of the second mesa body 162.

In image B, the respective stress element 241, 242 has a portion 19, which extends from the respective mesa body 161, 162 and which adopts a 45° angle with the first and second crystal axis 271, 272, respectively. The two portions 19 of the stress elements 241, 242 are flush in the 45° direction in relation to the crystal axes 271, 272. This configuration of the stress elements 241, 242 can feature more than 15 dB for the polarization extinction ratio of the first and second mesa body 161, 162, the polarization extinction ratio of the second mesa body 162 being higher than that of the first mesa body 161.

Image C shows a configuration of the stress elements 241, 242 which in terms of the alignment of their longitudinal directions 321, 322 corresponds to the configuration of image A. However, the stress elements 241, 242 are more than twice as narrow in the plane of the surface 22. This configuration of the stress elements 241, 242 can feature more than 15 dB for the polarization extinction ratio of the first and second mesa body 161, 162, the polarization extinction ratio of the second mesa body 162 being higher than that of the first mesa body 161 and preferably being able to be over 20 dB.

Image D shows a configuration of the stress elements 241, 242 in which the alignments of the longitudinal extents 321, 322 of the stress elements 241, 242 are both aligned parallel to the second crystal axis 272, at least in sections. In particular the portion 19 of the first stress element 241 is offset by 90° in contrast to image A, and hence parallel to the second crystal axis 272. The width of the stress elements 241, 242 is approximately the width from image C. This configuration of the stress elements 241, 242 can feature more than 15 dB for the polarization extinction ratio of the first and second mesa body 161, 162, the polarization extinction ratio of the first mesa body 161 being higher than that of the second mesa body 162, and both polarization extinction ratios preferably being able to be over 20 dB.

Figure 4:
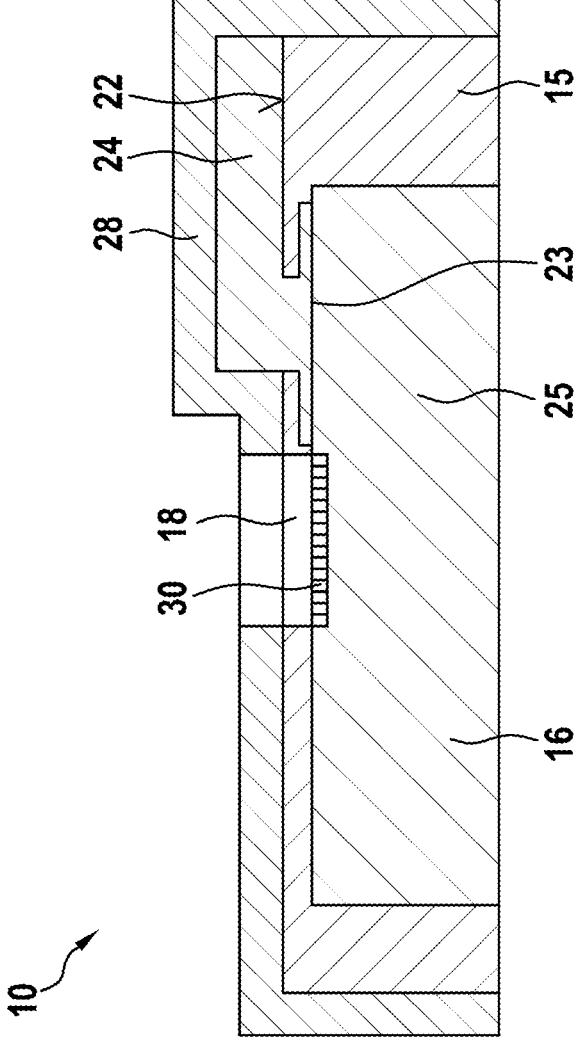
FIG. 4 shows a section through a semiconductor component with a stress element.

FIG. 4 shows a section through a semiconductor component 10, the section extending along a plane through the mesa body 16, the emission region 18 with the polarization grating 30, and a stress element 24.

The stress element 24 is electrically connected to the semiconductor component 10 via a feed device 23. The feed device 23 can be attached to the top side, which faces the surface 22, next to the emission region 18. The mesa body 16 is surrounded by a polymer or silicon nitride carrier layer 15, to which the stress element 24 has been at least partly applied. The material stress 25 is introduced into the mesa body 16, at least partly via the carrier layer 15.

The material stress 25 generated by the stress elements 24 can advantageously be influenced by virtue of an additional layer 28 being applied to the stress element 24 by means of atomic layer deposition 40. The layer 28 preferably also covers the remaining surface 22, with the layer 28 not covering the emission region 18 and the connection portions 26.

Figure 5:
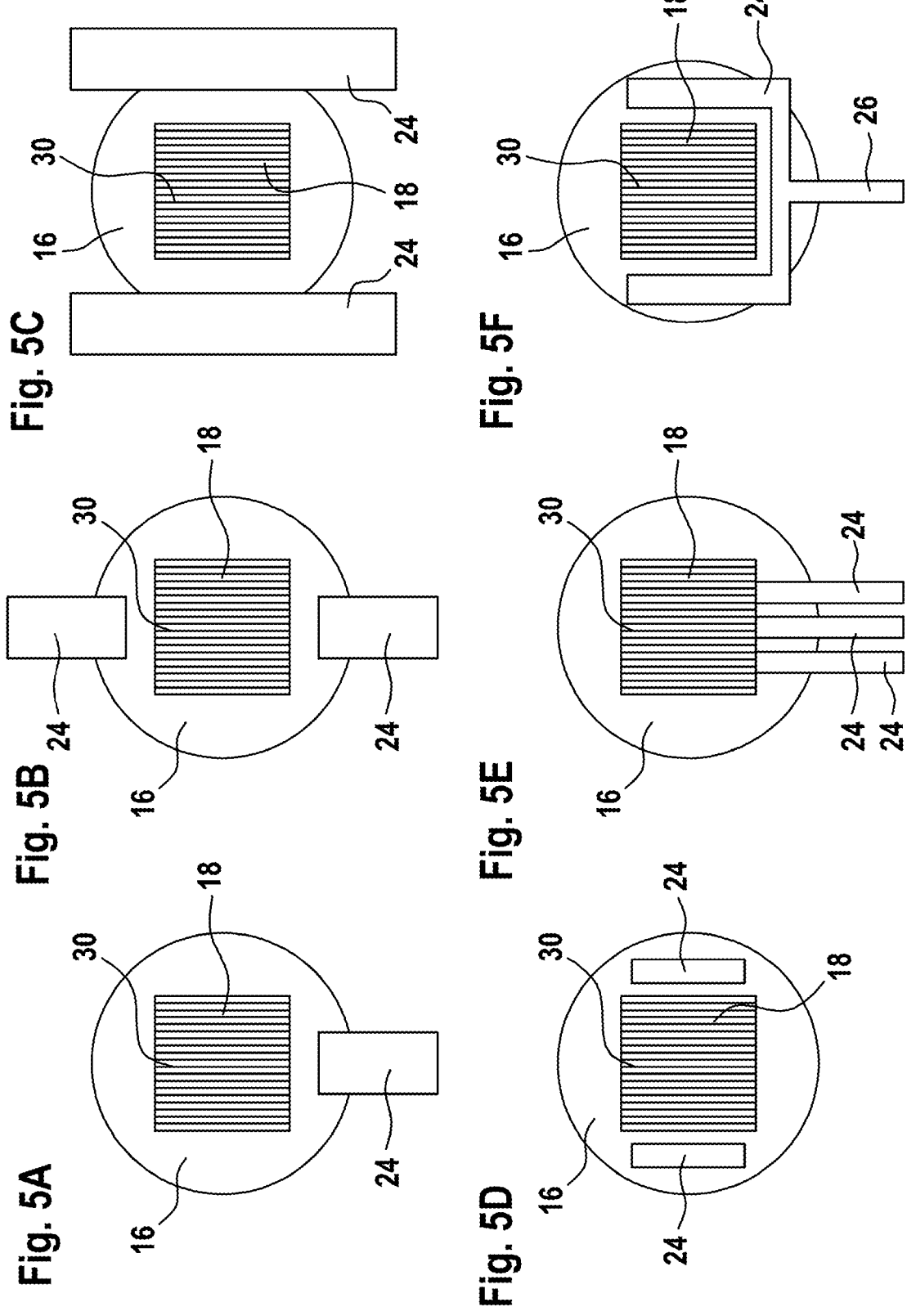
FIGS. 5A, 5B, 5C, 5D, 5E, and 5F show different embodiments of a mesa body having at least one stress element.

FIG. 5 depicts different exemplary embodiments of stress elements 24 on a mesa body 16 in images A to F. Embodiments A to F may be combined with one another on a semiconductor component 10.

Image A depicts a single stress element 24 which ends at the emission region 18 with one end, the stress element 24 forming a grating alignment of 0° with the polarization grating 30.

Two stress elements 24 are arranged in image B, said stress elements being arranged on opposite sides of the emission region 18 and the ends thereof being opposite one another. The stress elements 24 form a grating alignment of 0° with the polarization grating 30 and the stress elements 24 are preferably flush with one another.

Two stress elements 24 which are guided past the emission region 18 are arranged in image C, the stress elements 24 being able to extend beyond the emission region 18. The stress elements 24 are preferably longer than the extent of the emission region 18. The stress elements 24 form a grating alignment of 0° with the polarization grating 30 and are parallel to one another and to the grating ribs. The emission region 18 is arranged between the stress elements 24.

Image D shows an embodiment similar to that of image C, with the difference that the stress elements 24 are of the same length as the emission region 18 and the stress elements 24 preferably have a smaller width than in the case of image C.

Three mutually parallel stress elements 24 are arranged on one side of the emission region 18 in image E, and preferably reach approximately up to the polarization grating 30. The stress elements 24 form a grating alignment of 0° with the polarization grating 30 and are arranged next to one another.

Image F depicts a fork-shaped stress element 24, which has two tine-like portions whose embodiment relative to the emission region 18 is similar to that depicted in image D. The two tine-like portions are interconnected by an intermediate portion which has an alignment of 90° with respect to the polarization grating 30. In this case, the intermediate portion connects two ends of the tine-like portions which are arranged on the same side of the emission region 18. A connection portion 26 extends away from the intermediate portion, the connection portion 26 being directed away from the emission region 18.

Figure 6:
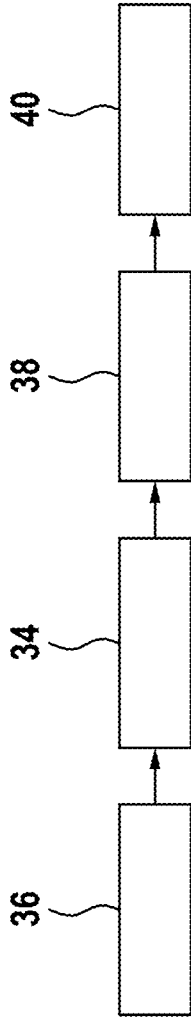
FIG. 6 shows a flowchart of a method for producing a material stress.

FIG. 6 is a flowchart of a method for producing a material stress 25 within a main body 14 of a semiconductor component 10. It contains a step of applying 34 a preferably metallic, in particular stripe-type stress element 24 to the surface 22 of the main body 14 during an annealing step 36. In this case, the stress element 24 may be applied by means of, for example, an evaporation method and/or plasma-enhanced chemical vapor deposition and/or any other deposition method during the annealing step 36.

The material stress arises in particular as a result of the main body 14 with the applied stress element 24 cooling, such that a material stress 25 forms. In particular, the material stress 25 forms an account of the materials of the crystalline semiconductor material and of the stress element 24 behaving differently during temperature changes. In the case of a stationary temperature of the semiconductor component 10, the material stress 25 is maintained at a constant level and thus stabilizes the polarization of the emitted light 12.

According to the method, a layer 28, also referred to as ALD layer, may be applied to the stress element 24 and/or the main body 14 by means of atomic layer deposition 40. The layer 40 can generate material stresses and/or amplify these. In particular, the layer 40 is applied after or during cooling 38.

A thin titanium layer may be applied between the ALD layer and the stress element 24.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE SIGNS

10 Semiconductor component
12 Light
14 Main body
15 Carrier layer
16 Mesa body
161 First mesa body
162 Second mesa body
171 First polarization direction
172 Second polarization direction
18 Emission region
181 First emission region
182 Second emission region
19 Portion
20 Electrical contacts
201 First contact
202 Second contact
203 Third contact
22 Surface
23 Feed device
24 Stress element
241 First stress element
242 Second stress element
25 Material stress
26 Connection portion
261 First connection portion
262 Second connection portion
263 Third connection portion
271 First crystal axis
272 Second crystal axis
28 ALD layer
30 Polarization grating
301 First polarization grating 302 Second polarization grating
32 Longitudinal extent
321 First longitudinal extent
322 Second longitudinal extent
34 Application
36 Annealing step
38 Cooling
40 Atomic layer deposition

The invention claimed is:

1. A semiconductor component for emitting light, the semiconductor component comprising:
   a main body that comprises at least one mesa body, the mesa body having an emission region for emitting the light, wherein the emission region is assigned a first mirror portion, a second mirror portion, and an active portion arranged between the two mirror portions and serving to produce the light,
   electrical contacts for feeding electrical energy into the active portion, with at least one stress element that is attached to a surface of the main body, and configured to generate, in the main body, a material stress which has an effect on one or more polarization properties of the emitted light,
   wherein at least one of the electrical contacts comprises the stress element, the stress element being a metallic coating on the mesa body.

2. The semiconductor component as claimed in claim 1, wherein the one or more polarization properties comprises a polarization extinction ratio.

3. The semiconductor component as claimed in claim 1, wherein the stress element is designed in a stripe-type fashion.

4. The semiconductor component as claimed in claim 3, wherein the stress element extends between the emission region and a connection portion of the electrical contact.

5. The semiconductor component as claimed in claim 1, wherein the at least one stress element comprises at least two separate stress elements that are attached to the main body, and each generate predominant material stresses in two different directions, respectively.

6. The semiconductor component as claimed in claim 5, wherein the two different directions extend at an angle of 0° or 90° with respect to one another.

7. The semiconductor component as claimed in claim 1, wherein the at least one stress element ends at the emission region.

8. The semiconductor component as claimed in claim 1, wherein the at least one stress element is guided past the emission region and extends beyond the emission region.

9. The semiconductor component as claimed in claim 1, wherein a longitudinal extent of the stress element includes an angle of 0°, 45°, or 90° with a crystal axis of the main body.

10. The semiconductor component as claimed in claim 1, wherein a layer is applied to the stress element by atomic layer deposition and/or plasma-enhanced chemical vapor deposition.

11. The semiconductor component as claimed in claim 10, wherein the layer covers a remaining surface of the main body to which that at least one stress element is not attached.

12. The semiconductor component as claimed in claim 1, wherein a polarization grating interacts with the emission region and is arranged on a surface of the mesa body, a grating alignment of the polarization grating includes an angle of 0°, 45° or 90° with a predominant direction of the material stress or a longitudinal extent of the stress element.

13. The semiconductor component as claimed in claim 1, wherein the stress element comprises at least two layers, which contain at least one of titanium, nickel, platinum, or gold.

14. The semiconductor component as claimed in claim 1, wherein the stress element is at least >1 μm long and >0.1 μm wide and >0.01 μm high.

15. The semiconductor component as claimed in claim 1, wherein the main body contains at least one of indium, gallium, arsenic or phosphorus.

16. A method for producing a material stress within a main body of a semiconductor component as claimed in claim 1, characterized by an application of a metallic stress element to a surface of the main body during an annealing step.

17. The method as claimed in claim 16, wherein the stress element is of a stripe-type.

18. The method as claimed in claim 16, characterized by a cooling of the main body with the stress element such that the material stress forms.

19. The method as claimed in claim 16, characterized by an application of a layer on the stress element and/or the main body by atomic layer deposition.

20. The semiconductor component as claimed in claim 5, wherein the two different directions extend at an angle of 45° with respect to one another.

* * * * *